United States Patent
Lee et al.

(10) Patent No.: US 11,112,914 B2
(45) Date of Patent: Sep. 7, 2021

(54) FORCE OPERATION SENSING DEVICE WITH COMMON NOISE CANCELLATION

(71) Applicant: Samsung Electro-Mechanics Co., Ltd., Suwon-si (KR)

(72) Inventors: Joo Hyoung Lee, Suwon-si (KR); Joo Yul Ko, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 0 days.

(21) Appl. No.: 16/822,951

(22) Filed: Mar. 18, 2020

(65) Prior Publication Data

US 2021/0157424 A1 May 27, 2021

(30) Foreign Application Priority Data

Nov. 26, 2019 (KR) .................. 10-2019-0153232

(51) Int. Cl.
   *G06F 3/044* (2006.01)
   *G06F 3/041* (2006.01)
   *G01R 23/02* (2006.01)

(52) U.S. Cl.
   CPC .......... *G06F 3/044* (2013.01); *G06F 3/04144* (2019.05); *G01R 23/02* (2013.01); *G06F 2203/04103* (2013.01)

(58) Field of Classification Search
   CPC ................ G06F 3/044; G06F 3/04144; G06F 2203/04103; G01R 23/02
   See application file for complete search history.

(56) References Cited

U.S. PATENT DOCUMENTS

| | | | |
|---|---|---|---|
| 10,418,011 B1* | 9/2019 | Harms | ................ G10H 1/0551 |
| 2015/0130649 A1 | 5/2015 | Itakura et al. | |
| 2015/0202848 A1* | 7/2015 | Cho | ....................... B32B 17/00 428/206 |
| 2016/0241687 A1 | 8/2016 | Son | |
| 2017/0269754 A1* | 9/2017 | Liu | ...................... G06F 3/0444 |

(Continued)

FOREIGN PATENT DOCUMENTS

| | | |
|---|---|---|
| JP | 2012-168747 A | 9/2012 |
| JP | 2015-95865 A | 5/2015 |

(Continued)

OTHER PUBLICATIONS

Korean Office Action dated Nov. 30, 2020 in counterpart Korean Patent Application No. 10-2019-0153232 (5 pages in English, 4 pages in Korean).

*Primary Examiner* — Kwang-Su Yang
(74) *Attorney, Agent, or Firm* — NSIP Law

(57) ABSTRACT

A force operation sensing device is provided. The device includes an input operation unit comprising a first operating member integrally formed with a housing, a magnetic member disposed inside the input operation unit, and an oscillating circuit comprising a first inductor element and a second inductor element, wherein when a force operation is applied to the first operating member, the oscillating circuit is configured to generate a first variable resonant frequency based on an interaction between the first operating member and the first inductor element, and generate a second variable resonant frequency based on an interaction between the magnetic member and the second inductor element.

20 Claims, 16 Drawing Sheets

(56) References Cited

U.S. PATENT DOCUMENTS

2018/0093695 A1    4/2018  Hattori et al.
2018/0120364 A1    5/2018  Lee et al.
2020/0400513 A1*  12/2020  Jung .................. G06F 3/04144

FOREIGN PATENT DOCUMENTS

| KR | 10-2001-0039503 A | 5/2001 |
| KR | 2002-0077836 A | 10/2002 |
| KR | 10-2009-0120709 A | 11/2009 |
| KR | 10-2011-0087004 A | 8/2011 |
| KR | 10-2011-0087014 A | 8/2011 |
| KR | 10-2016-0100674 A | 8/2016 |
| KR | 10-2018-0046833 A | 5/2018 |
| KR | 10-2019-0087339 A | 7/2019 |

* cited by examiner

FORCE OPERATION SENSING DEVICE WITH COMMON NOISE CANCELLATION

CROSS-REFERENCE TO RELATED APPLICATIONS

This application claims the benefit under 35 USC 119(a) of Korean Patent Application No. 10-2019-0153232 filed on Nov. 26, 2019 in the Korean Intellectual Property Office, the entire disclosure of which is incorporated herein by reference for all purposes.

BACKGROUND

1. Field

The following description relates to a force operation sensing device with common noise cancellation.

2. Description of Related Art

It is typically preferable that wearable devices have a thinner, simpler, and cleaner design. To that extent, typical mechanical switches are rarely being implemented in wearable devices. Dustproof and waterproof technologies are currently being implemented, therefore resulting in models that have a smooth and unified form factor.

Currently, technologies such as a touch on metal (ToM) technology for touching an upper portion of a metal, a capacitor sensing technique using a touch panel, a micro-electro-mechanical-system (MEMS), a force-touching function, and a micro strain gauge are being developed. Furthermore, a force touch function is being developed.

With regard to typical mechanical switches, a relatively large amount of internal or inner size and space may be needed to implement switch functions. Additionally, in structures in which a switch is not integrated with an external case, the mechanical switches may result in a structure that has an externally protruding design. Accordingly, a structure that has a mechanical switch may result in an obtrusive design, and may need a large inner space.

Additionally, there may be a risk of electric shocks if direct contact is made with the electrically connected mechanical switch, and dust-proofing and waterproofing implementations may be difficult due to the structural deficiencies of mechanical switches.

Additionally, various methods for performing a button function without using a dedicated button may be implemented, but to further increase sensitivity, strong resistance to noise is desired.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In a general aspect, a force operation sensing device to be added to an electronic device, the electronic device including an input operation unit comprising a first operating member disposed in a housing, the force operation sensing device including: a magnetic member disposed inside the input operation unit, and an oscillating circuit comprising a first inductor element and a second inductor element, wherein when a force operation is applied to the first operating member, the oscillating circuit is configured to generate a first variable resonant frequency based on an interaction between the first operating member and the first inductor element, and generate a second variable resonant frequency based on an interaction between the magnetic member and the second inductor element.

The first inductor element may be disposed adjacent to the first operating member, and the second inductor element may be disposed to face the magnetic member.

The device may further include a force detection circuit configured to determine a frequency difference between the first variable resonant frequency and the second variable resonant frequency, and detect the force operation based on the determined frequency difference.

The oscillating circuit may further include a first oscillating circuit configured to generate a first oscillation signal comprising the first variable resonant frequency, and a second oscillating circuit configured to generate a second oscillation signal comprising the second resonant frequency which is inversely varied with the variation of the first resonant frequency.

The first inductor element may be spaced apart from an inner surface of the first operating member, and is mounted on a first surface of a substrate, the second inductor element may be respectively spaced apart from the inner surface of the first operating member and the first inductor element, and is mounted on the first surface of the substrate, and the magnetic member may be spaced apart from the first inductor element and the second inductor element, faces the second inductor element, and is attached to the inner surface of the first operating member.

The force detection circuit may further include a digital frequency converter configured to convert the first oscillation signal into a first count value, and convert the second oscillation signal into a second count values; and a force detector configured to determine the frequency difference based on the first count value and the second count value, and detect the force operation based on the determined frequency difference.

The digital frequency converter may include a first digital frequency converter configured to generate the first count value by counting a reference clock signal based on the first oscillation signal; and a second digital frequency converter configured to generate the second count value by counting the reference clock signal based on the second oscillation signal.

The first inductor element may be attached to an inner surface of the first operating member, the second inductor element faces the magnetic member, is mounted on a first surface of a substrate, and is spaced apart from the magnetic member, and the magnetic member is respectively spaced apart from the first inductor element and the second inductor element, faces the second inductor element, and is disposed on the inner surface of the first operating member, wherein the force operation sensing device further comprises a first conductive member respectively spaced apart from the first inductor element and the second inductor element, faces the first inductor element, and is mounted on the first surface of the substrate.

The first inductor element may be mounted on a first surface of a substrate, and a second surface of the substrate is attached to an inner surface of the first operating member, the second inductor element may be spaced apart from the first inductor element, and may be mounted on the first surface of the substrate, and the magnetic member may be respectively spaced apart from the first inductor element and the second inductor element, may be disposed on a bracket, and may face the second inductor element, wherein the force operation sensing device may further include a second conductive member spaced apart from the magnetic member, may be disposed on the bracket, and may face the first inductor element.

The first inductor element may be mounted on a first surface of a substrate, and may be spaced apart from an inner surface of the first operating member, the second inductor element may be attached to the inner surface of the first operating member, and the magnetic member may be respectively spaced apart from the first inductor element and the second inductor element, is mounted on the first surface of the substrate, and faces the second inductor element.

The first inductor element may be spaced apart from an inner surface of the first operating member, and may be mounted on a first surface of a substrate, the second inductor element is mounted on the first surface of the substrate, and is respectively spaced apart from an inner surface of the first operating member and the first inductor element, and the magnetic member is spaced apart from the first inductor element and the second inductor element, is attached to the inner surface of the first operating member, and faces the second inductor element, wherein the force operation sensing device may further include a connection member disposed between the first operating member and a bracket, and is configured to connect the first operating member and the bracket.

The first oscillating circuit may include a capacitance circuit including a capacitance of a capacitor element; and an inductance circuit including an inductance of the first inductor element.

The second oscillating circuit may include a capacitance circuit including a capacitance of a capacitor element; and an inductance circuit including an inductance of the second inductor element.

The first digital frequency converter may include a first frequency down converter configured to divide the reference clock signal by using a reference division ratio to generate a first divided reference clock signal, a first period timer configured to generate a first period count value by counting one period of time of the first divided reference clock signal based on the first oscillation signal; and a first cascaded integrator-comb (CIC) filter circuit configured to generate the first count value by performing cumulative amplification on the first period count value.

The second digital frequency converter may include a second frequency down converter configured to divide the reference clock signal by using a reference division ratio to generate a second divided reference clock signal, a second period timer configured to generate a second period count value by counting one cycle of time of the second divided reference clock signal based on the second oscillation signal; and a second CIC filter circuit configured to generate the second count value by performing cumulative amplification on the second period count value.

The first oscillation signal may be two or more times higher than a frequency of the reference clock signal, and the second oscillation signal may be two or more times higher than the frequency of the reference clock signal.

The force detector may include a subtractor configured to subtract the first count value and the second count value to obtain the determined frequency difference, and an adder configured to add the determined frequency difference and a reference value to generate a detection signal.

The first operating member may have conductive properties.

In a general aspect, an apparatus includes an input operation unit, an oscillating circuit configured to generate at least a first oscillating signal and a second oscillating signal based on an application of a force to the operating member; and a force detection circuit configured to convert the first oscillating signal into a first count value, and convert the second oscillating signal into a second count value, determine a frequency difference of the first oscillating signal and the second oscillating signal based on the first count value and the second count value; and detect the application of the force based on the determined frequency difference.

The first oscillating signal may be generated based on an interaction between the operating member and a first inductor element of the oscillating circuit, and the second oscillating signal may be generated based on an interaction between a magnetic member and a second inductor element of the oscillating circuit.

Other features and aspects will be apparent from the following detailed description, the drawings, and the claims.

Figure 1:
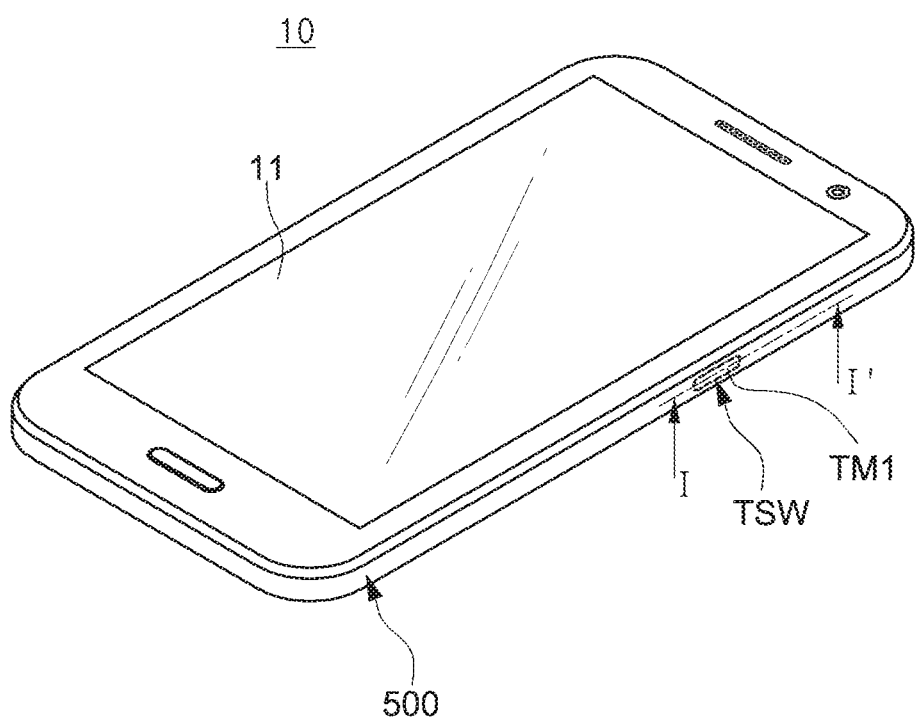
FIG. 1 illustrates the exterior of a mobile device, in accordance with one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The drawings may not be to scale, and the relative size, proportions, and depiction of elements in the drawings may be exaggerated for clarity, illustration, and convenience.

Subsequently, examples are described in further detail with reference to the accompanying drawings.

FIG. 1 illustrates an example of the exterior of a mobile device, in accordance with one or more embodiments.

Referring to FIG. 1, a mobile device 10 according to an example may include a touch screen 11, a housing 500, and an input operation unit TSW including a first operating member TM1 that replaces a mechanical button switch.

Although FIG. 1 illustrates an example in which the input operation unit TSW includes a single operating member TM1 by way of example for convenience of description, the input operation unit TSW is not limited to a single operating member TM1. For example, the number of operating members may be expanded to a number greater than one.

For example, referring to FIG. 1, the mobile device 10 may be a portable device, such as, but not limited to, a laptop, a notebook, a personal computer, a virtual reality (VR) device, an augmented reality (AR) device, a smartphone, or may be a wearable device, such as a smart watch, and is not limited to a specific device. For example, the mobile device 10 may be a portable or wearable electric device or an electric device that has a switch for operational control.

The housing 500 may be an outer case that is exposed to the exterior of the integrally formed electric device. For example, when a touch input sensing device is applied to a mobile device, the touch input sensing device may be a cover disposed on at least one side of the mobile device 10. For example, the housing 500 may be integrally formed with a cover disposed on the rear of the mobile device 10, or may be separated from the cover disposed on the rear of the mobile device 10.

As described above, the housing 500 may be an external case of an electric device, and is not particularly limited to a specific position, form, or structure.

Referring to FIG. 1, the first operating member TM1 may be disposed in the housing 500 of the mobile device, but the examples are not limited thereto.

The first operating member TM1 may be disposed on a cover of the mobile device. In this case, the cover may be a cover other than the touch screen. In an example, the cover may be a side cover, a rear cover, or a cover that may be formed on a portion of the front surface. For example, the case in which the first operating member TM1 is disposed on the side cover of the mobile device as an example of the housing for convenience of description. However, the examples are not limited thereto.

For respective drawings of the present disclosure, overlapping descriptions of the same reference numerals and the same functional elements may be omitted, and a description of differences for respective figures may be described.

Additionally, the matters or letters illustrated in the drawings are merely examples and are not limited thereto.

Figure 2:
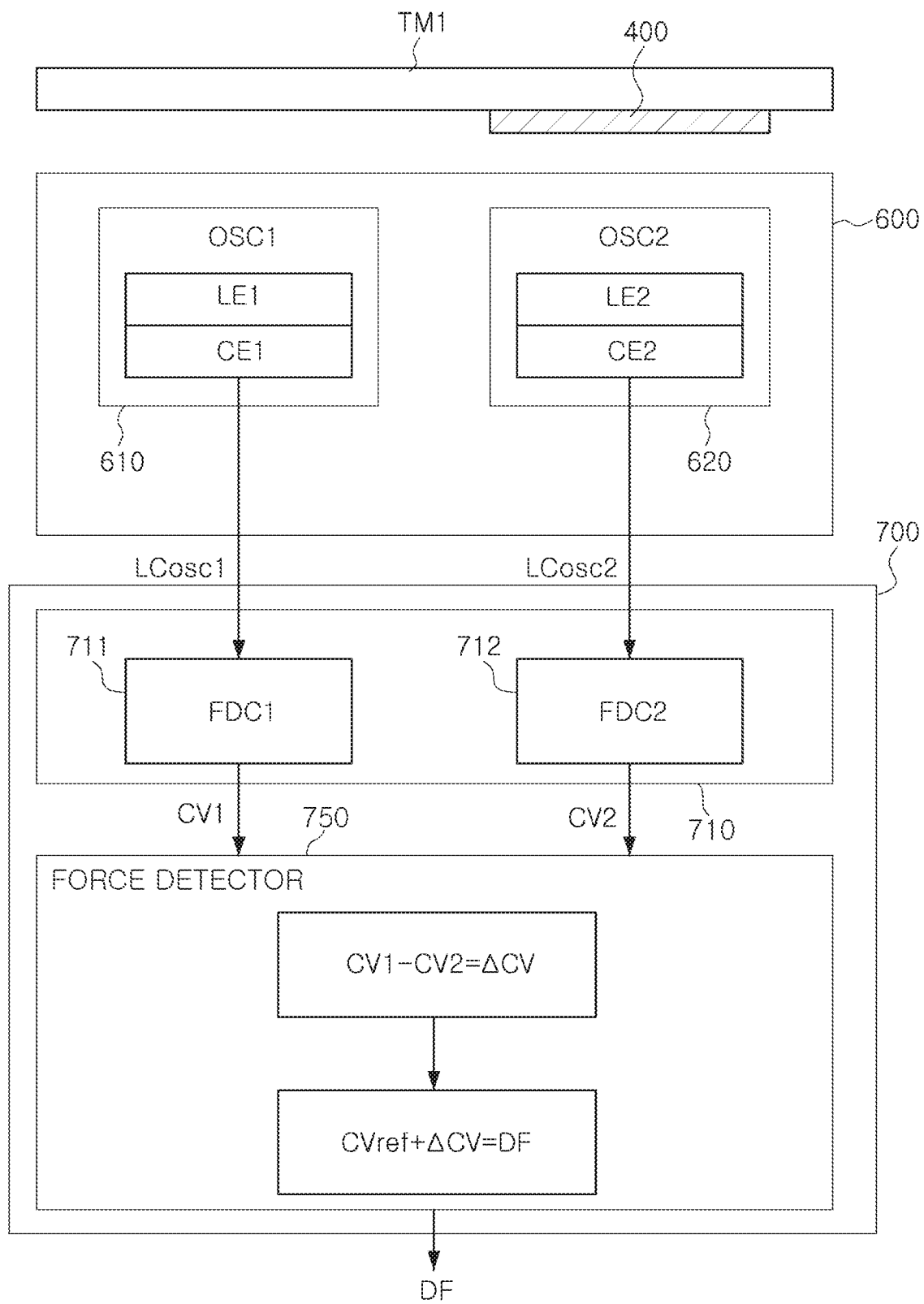
FIG. 2 illustrates an example of a force operation sensing device, in accordance with one or more embodiments.

FIG. 2 illustrates an example of a force operation sensing device, in accordance with one or more embodiments.

Referring to FIG. 2, the force operation sensing device according to an example may include the input operation unit TSW, a magnetic member 400, an oscillating circuit 600.

The force operation sensing device may further include a force detection circuit 700.

The input operation unit TSW may include a conductive first operating member TM1 integrally formed with the housing 500. Although only the first operating member TM1 is illustrated in FIG. 1, the examples are not limited thereto. For example, a plurality of operating members may be integrally formed with the housing 500.

The magnetic member 400 is disposed internal to the input operation unit TSW, and may have a magnetic property that is different from a magnetic property of the input operation unit TSW. However, this is only an example, and the magnetic member 400 may have a magnetic property that is the same as a magnetic property of the input operation unit TSW. The magnetic member 400 may remove common noise, and may be formed of, for example, ferrite. However, this is only an example, and the magnetic member 400 may be formed of other materials.

The oscillating circuit 600 may include a first inductor element LE1 disposed adjacent to the first operating member TM1, and a second inductor element LE2 disposed to face the magnetic member 400. When a touch or force operation is applied to the first operating member TM1, the oscillating circuit 600 may generate a first variable resonant frequency fres1 based on an interaction between the input operation unit TSW and the first inductor element LE1, and may generate a second variable resonant frequency fres2 based on an interaction between the magnetic member 400 and the second inductor element LE2.

In the examples, the operation applied to the first operating member TM1 may include a touch act of touching a contact surface of the first operating member TM1, or a force act that presses against the contact surface of the first operating member TM1.

Additionally, in the examples, when "opposite arrangements" is discussed, 'opposite' may refer to elements that each other while being spaced apart from each other.

For example, when a touch or force operation is applied to the first operating member TM1 and the first resonant frequency fres1 rises, the second resonant frequency fres2 may be reversed to the variable of the first resonant frequency fres1, and thus may decrease. As another example, when a touch or force operation is applied to the first operating member TM1 and the first resonant frequency fres1 is lowered, the second resonant frequency fres2 may rise inversely to the variable of the first resonant frequency fres1.

Then, the force detection circuit 700 may obtain a frequency difference $\Delta f$ between the first resonant frequency fres1 and the second resonant frequency fres2 and may detect the application of the operation based on the frequency difference $\Delta f$.

Referring again to FIG. 2, the oscillating circuit 600 may include a first oscillating circuit OSC1 610 and a second oscillating circuit OSC2 620.

The first oscillating circuit 610 may include the first inductor element LE1 disposed adjacent to the first operating member TM1, and when a force operation is applied to the first operating member TM1, the first oscillating circuit 610 may generate a first oscillation signal LCosc1 having the first variable resonant frequency fres1 that is based on the interaction between the input operation unit TSW and the first inductor element LE1. In an example, the first oscillating circuit 610 may include the first inductor element LE1 and a first capacitor element CE1.

The second oscillating circuit 620 may include the second inductor element LE2 that may be spaced apart from the magnetic member 400 by a predetermined interval. When a force operation is applied to the first operating member TM1, the oscillating circuit 620 may generate a second oscillation signal LCosc2 having a second resonant frequency fres2 which is inversely varied with the variation of the first resonant frequency fres1 by the magnetic member 400 and the second inductor element LE2. In an example, the second oscillating circuit 620 may include the second inductor element LE2 and a second capacitor element CE2.

As described above, when a force operation is applied to the first operating member TM1 and in the example in which the first resonant frequency fres1 rises, the second resonant frequency fres2 may be lowered. In an example, when a force operation is applied to the first operating member TM1 and in the example in which the first resonant frequency fres1 is lowered, the second resonant frequency fres2 may be increased.

In an example, the force detection circuit 700 may include a digital frequency converter 710 and a force detector 750.

The digital frequency converter 710 may convert the first oscillation signal LCosc1 into a first count value CV1, and may convert the second oscillation signal LCosc2 into a second count value CV2.

The force detector 750 may obtain the frequency difference $\Delta f$ based on the first count value CV1 and the second count value CV2, and detect the application of the touch or force operation based on the frequency difference $\Delta f$.

In an example, the digital frequency converter 710 may include a first digital frequency converter (FDC1) 711 and a second digital frequency converter (FDC2) 712.

The first digital frequency converter (FDC1) 711 may generate the first count value CV1 by counting a reference clock signal CLK_ref using the first oscillation signal LCosc1.

The second digital frequency converter (FDC2) 712 may generate the second count value CV2 by counting the reference clock signal CLK_ref using the second oscillation signal LCosc2.

When the first count value CV1 and the second count value CV2 are obtained in this manner, unlike the typical counting method that uses a clock signal having a high frequency, a reference clock signal CLK_ref of a low frequency may be used, thereby increasing the precision of counting.

Figure 3:
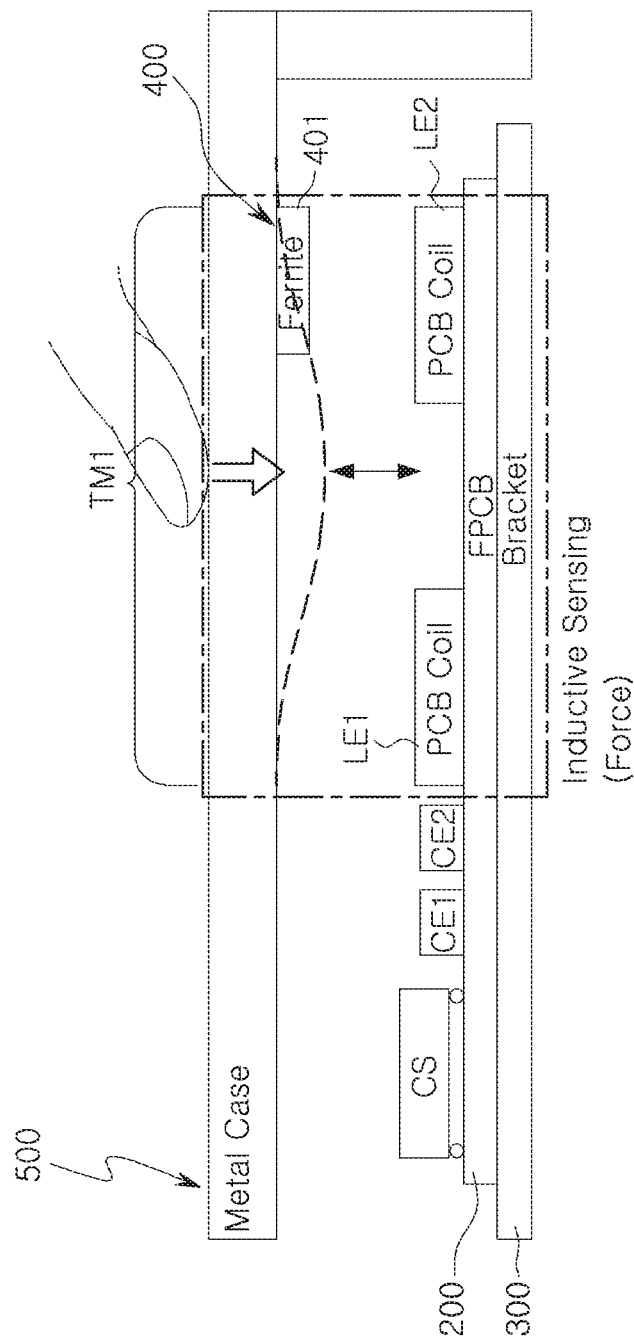
FIG. 3 illustrates an example of a sensing structure of a mobile device, in accordance with one or more embodiments.

FIG. 3 illustrates an example of a sensing structure taken along line I-1' of FIG. 1.

Referring to FIG. 3, the first inductor element LE1 may be mounted on one surface of a substrate 200 to be spaced apart from an inner surface of the first operating member TM1. The second inductor element LE2 may be mounted on one surface of the substrate 200 to be respectively spaced apart from an inner surface of the first operating member TM1 and the first inductor element LE1.

In a non-limiting example, the first inductor element LE1 and the second inductor element LE2 may be PCB coils or chip inductors. However, the examples are not limited thereto. For example, as the first and second inductor elements LE1 and LE2, any device or chip having inductance may be used.

To implement a differential sensing structure, as non-limiting examples, the magnetic member 400 may be spaced apart from the first inductor element LE1 and the second inductor element LE2, may face the second inductor element LE2, and may be attached to the inner surface of the first operating member TM1, but examples thereof are not limited thereto.

The sensing structure illustrated in FIG. 3 may include a structure where the first inductor element LE1 and the first operating member TM1 are spaced apart from each other, and the second inductor element LE2 and a magnetic member 401 are spaced apart from each other, to perform inductive sensing operations.

In an example, when a touch or force is applied to the first operating member TM1, a distance between the first operating member TM1 and the first inductor element LE1 is reduced, and accordingly, inductance of the first inductor element LE1 is reduced by an eddy current effect between the first operating member TM1 and the first inductor element LE1, and the first resonant frequency fres1 contributed by the inductance of the first inductor element LE1 is increased.

Additionally, in FIG. 3, a circuit unit CS may include a portion, for example, an amplifier, of the oscillating circuit 600, and the force detection circuit 700, and for example, may be mounted on one surface of the substrate 200. The first and second capacitor elements CE1 and CE2 may be included in the first and second oscillating circuits 610 and 620 of the oscillating circuit 600 to provide capacitance, and for example, may be mounted on one surface of the substrate 200. The substrate 200 may be supported by a bracket 300.

The bracket 300 may support the substrate 200, and may be attached to or installed in an internal structure of an electronic device. Accordingly, the bracket 300 may be configured in such a manner that a distance between the first inductor element LE1 and the first operating member TM1 and a distance between the second inductor element LE2 and the magnetic member 401 may be constantly maintained, to perform an inductive sensing operation in which the application of force may be detected by the sensing structure illustrated in FIG. 3.

An inductive sensing structure and a sensing operation applied to respective examples will be described.

By using an inductive sensing structure as illustrated in FIG. 3, the application of a force to the first operating member TM1 may be detected, and common noises may be removed while detecting such force application. When the first and second inductor elements are PCB coils, the oscillating circuit 600 connected thereto may be sensitive to power supply noise, and the inductance or capacitance of the oscillating circuit may change depending on temperature.

In this example, as illustrated in FIG. 3, one sensor structure having one first operating member TM1 may include the first and second inductor elements LE1 and LE2 (for example, PCB coils) disposed at a predetermined distance from the first operating member TM1, and when the magnetic member 401 (for example, a ferrite member) having a relatively high permeability is attached to the first operating member TM1 of the housing, the distance between the first operating member TM1 and the first inductor element LE1 may change based on a change in force applied to the first operating member TM1, and a differential change may occur in the first and second inductor elements LE1 and LE2.

For example, when the distance between the first operating member TM1 and the first inductor element LE1 is reduced, a change in the magnetic field formed therebetween occurs, and in this example, an eddy current occurring in the first operating member TM1 which is formed of a metal component increases. As the eddy current increases, the magnetic field caused by eddy current increases, thus disturbing the basic magnetic field, and thus lowering an inductance value of the first inductor element LE1.

On the other hand, the magnetic member 401, which may be formed of ferrite or a similar material, has the opposite effect to that of the first operating member TM1 formed of a metal. For example, when the change in inductance caused by the first operating member TM1 is '−ΔL', the change in inductance of the second inductor element LE2 due to the magnetic member 401 formed of a ferrite or a similar material becomes '+ΔL', resulting in an increase in inductance of the second inductor element LE2.

Therefore, as the distance between the first operating member TM1 and the first inductor element LE1 is reduced, the inductances of the first and second inductor elements LE1 and LE2 may be changed opposite to each other. In this example, by using the difference in resonant frequency caused by the inductance of the first and second inductor elements LE1 and LE2, based on such a differential sensing structure, the sensing sensitivity may be much higher than a typical sensing structure that is not a differential sensing structure.

Additionally, when the sensor structure including the first and second inductor elements LE1 and LE2 such as the PCB coils is used, the influence on the power supply and the temperature is equally applied. Thus, by subtracting two count values provided by converting frequencies of two transmitting signals output from the oscillating circuit, noise by the power supply or common noise such as a change due to temperature may be eliminated, and a signal having a relatively higher value may be obtained.

The principle of operation in the differential sensing structure as described above may be applied to other examples, and repeated description thereof may be omitted.

Figure 4:
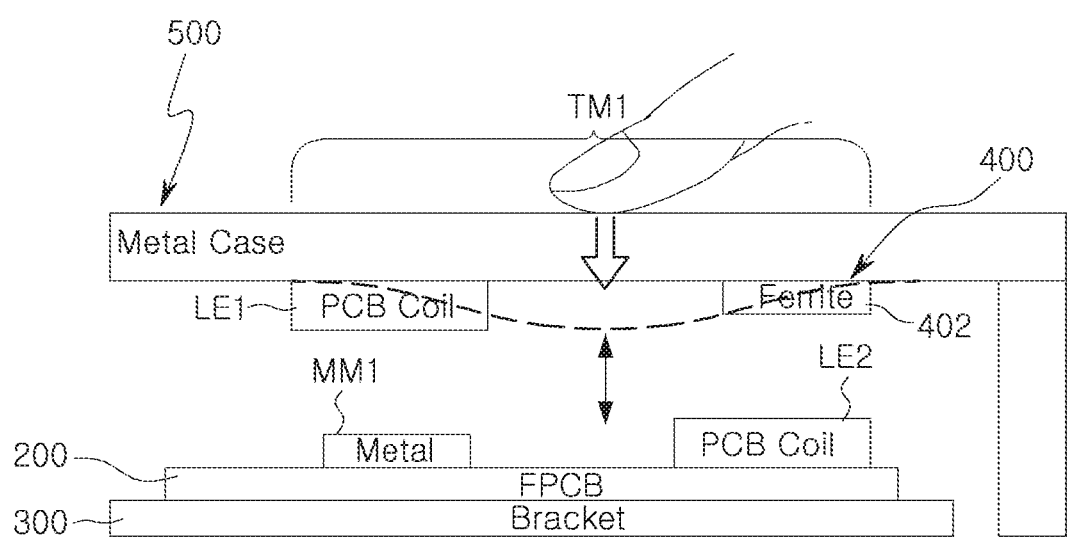
FIG. 4 illustrates an example of a sensing structure of a force operation sensing device, in accordance with one or more embodiments.

FIG. 4 illustrates an example of a sensing structure of a force operation sensing device, in accordance with one or more embodiments.

Referring to FIG. 4, the first inductor element LE1 may be attached to an inner surface of the first operating member TM1. The second inductor element LE2 may face the magnetic member 400, and may be mounted on one surface of the substrate 200 spaced apart from the magnetic member 400.

To implement a differential sensing structure, the magnetic member 400 may be respectively spaced apart from the first inductor element LE1 and the second inductor element LE2, and may face the second inductor element LE2. Additionally, the magnetic member 400 may be disposed on the inner side of the first operating member TM1. However, the examples are not limited thereto.

In FIG. 4, the force operation sensing device may further include a first conductive member MM1. The first conductive member MM1 may be respectively spaced apart from the first inductor element LE1 and the second inductor element LE2, may face the first inductor element LE1, and may be disposed on the substrate 200. However, the examples are not limited thereto.

The substrate 200 may be supported by the bracket 300, and the bracket 300 may be attached to, or installed in, an internal structure of the electronic device.

In a non-limiting example, the sensing structure illustrated in FIG. 4 may be a structure including the first inductor element LE1 and the first conductive member MM1 spaced apart from each other, and the second inductor element LE2 and a magnetic member 402 spaced apart from each other, thereby performing inductive sensing.

Figure 5:
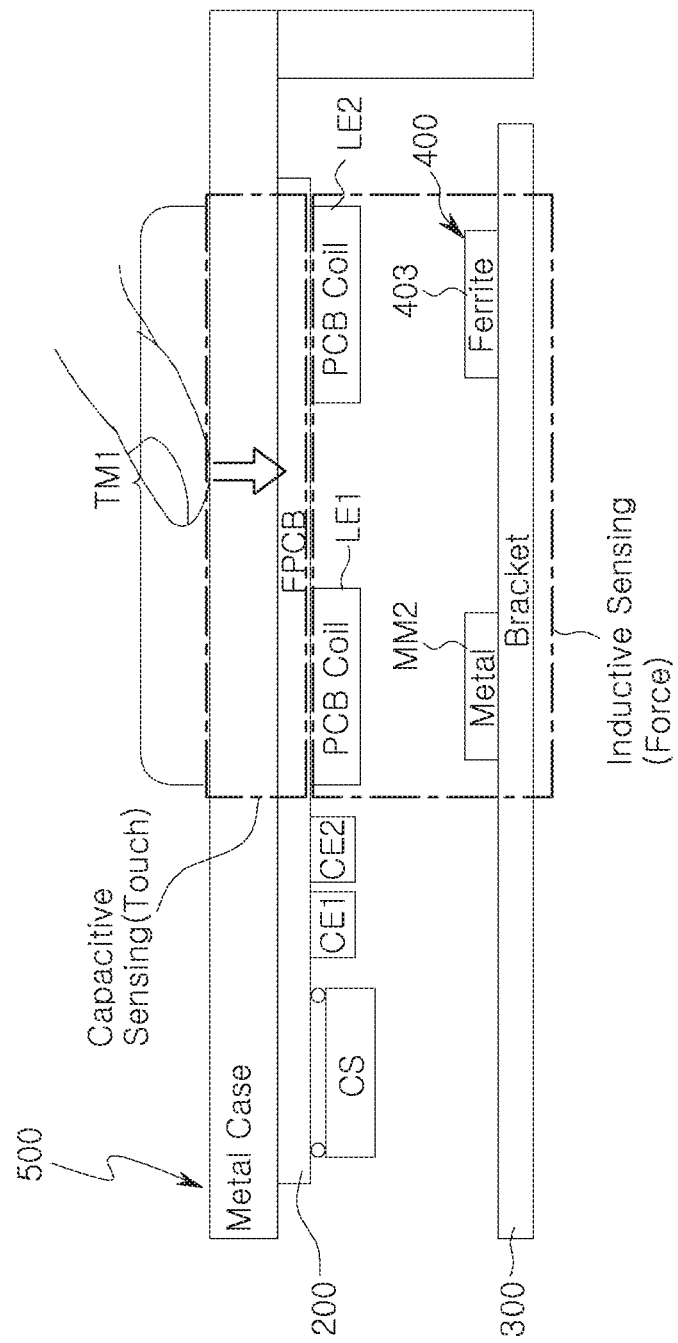
FIG. 5 illustrates an example of a sensing structure of a force operation sensing device, in accordance with one or more embodiments.

FIG. 5 illustrates an example of a sensing structure of a force operation sensing device, in accordance with one or more embodiments.

Referring to FIG. 5, the first inductor element LE1 may be mounted on a second surface of the substrate 200, which has a first surface attached to an inner surface of the first operating member TM1. The second inductor element LE2 may be mounted on the second surface of the substrate 200, while being spaced apart from the first inductor element LE1.

To implement a differential sensing structure, the magnetic member 403 may be respectively spaced apart from the first and second inductor elements LE1 and LE2, may face the second inductor element LE2, and may be disposed on the bracket 300, but the examples are not limited thereto.

In FIG. 5, the force operation sensing device may further include a second conductive member MM2. The second conductive member MM2 may be spaced apart from the magnetic member 403, may face the first inductor element LE1, and may be disposed on the bracket 300, but is the examples are not limited thereto.

In a non-limiting example, the first operating member TM1 and the magnetic member 400 may be respectively formed of a metal and ferrite. However, the examples are not limited thereto. As the material of each of the first operating member TM1 and the magnetic member 400, any material in which the magnetic field influence directions are opposite to each other while performing an inductive sensing operation in connection with the first and second inductor elements LE1 and LE2 may be used.

The sensing structure illustrated in FIG. 5 may include a capacitive sensing structure and an inductive sensing structure, thereby providing an improved structure as compared to the sensing structure illustrated in FIG. 3.

The sensing structure illustrated in FIG. 5 may include a sensing structure having a first operating member TM1 and a substrate 200, thereby performing a capacitive sensing operation.

Additionally, the sensing structure illustrated in FIG. 5 may include a sensing structure including the first inductor element LE1 and the second conductive member MM2 spaced apart from each other, and the second inductor element LE2 and the magnetic member 403 spaced apart from each other, thereby performing an inductive sensing operation.

Figure 6:
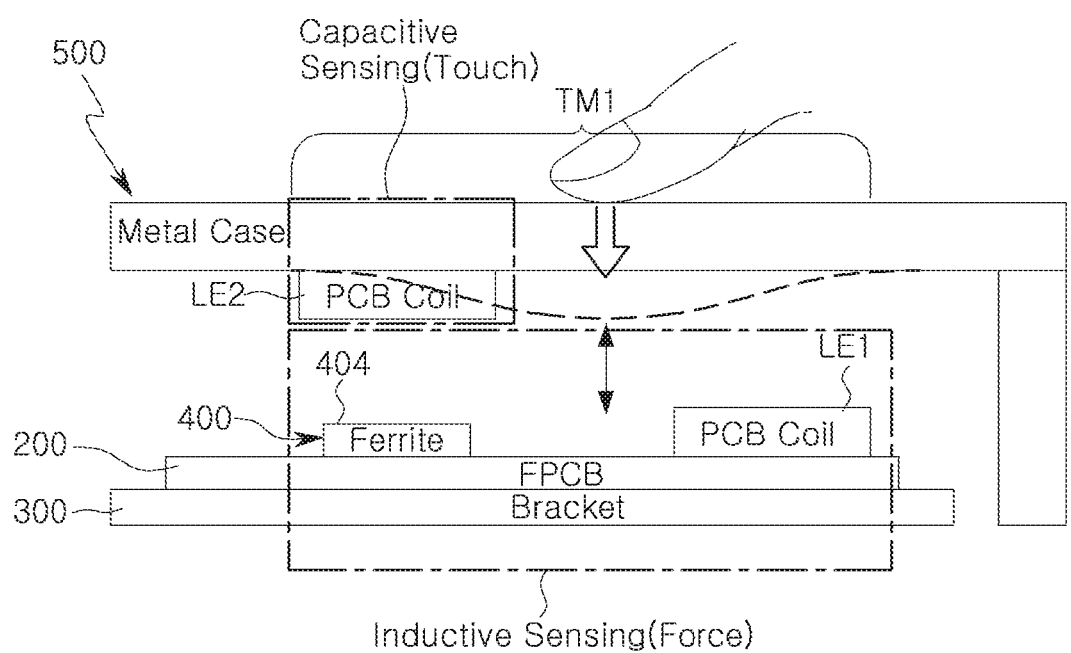
FIG. 6 illustrates an example of a sensing structure of a force operation sensing device, in accordance with one or more embodiments.

FIG. 6 illustrates an example of a sensing structure of a force operation sensing device, in accordance with one or more embodiments.

Referring to FIG. 6, the first inductor element LE1 may be mounted on a first surface of the substrate 200, and spaced apart from an inner surface of the first operating member TM1. The second inductor element LE2 may be attached to an inner surface of the first operating member TM1, and arranged to face the magnetic member 400 in a spaced apart manner.

To implement a differential sensing structure, the magnetic member 400 may be respectively spaced apart from the first inductor element LE1 and the second inductor element LE2, may face the second inductor element LE2, and may be mounted on the substrate 200. However, the examples are not limited thereto.

The substrate 200 may be supported by a bracket 300, and the bracket 300 may be attached to, or installed in, an internal structure of an electronic device.

The sensing structure illustrated in FIG. 6 may include a capacitive sensing structure and an inductive sensing structure, and may perform an improved function compared with the sensing structure illustrated in FIG. 3.

The sensing structure illustrated in FIG. 6 may include a sensing structure having a first operating member TM1 and a second inductor element LE2 that perform a capacitive sensing operation.

Additionally, the sensing structure illustrated in FIG. 6 may include a sensing structure including a first inductor element LE1 and a first operating member TM1 spaced apart from each other, and a second inductor element LE2 and a magnetic member 404 spaced apart from each other, thereby performing an inductive sensing operation.

Figure 7:
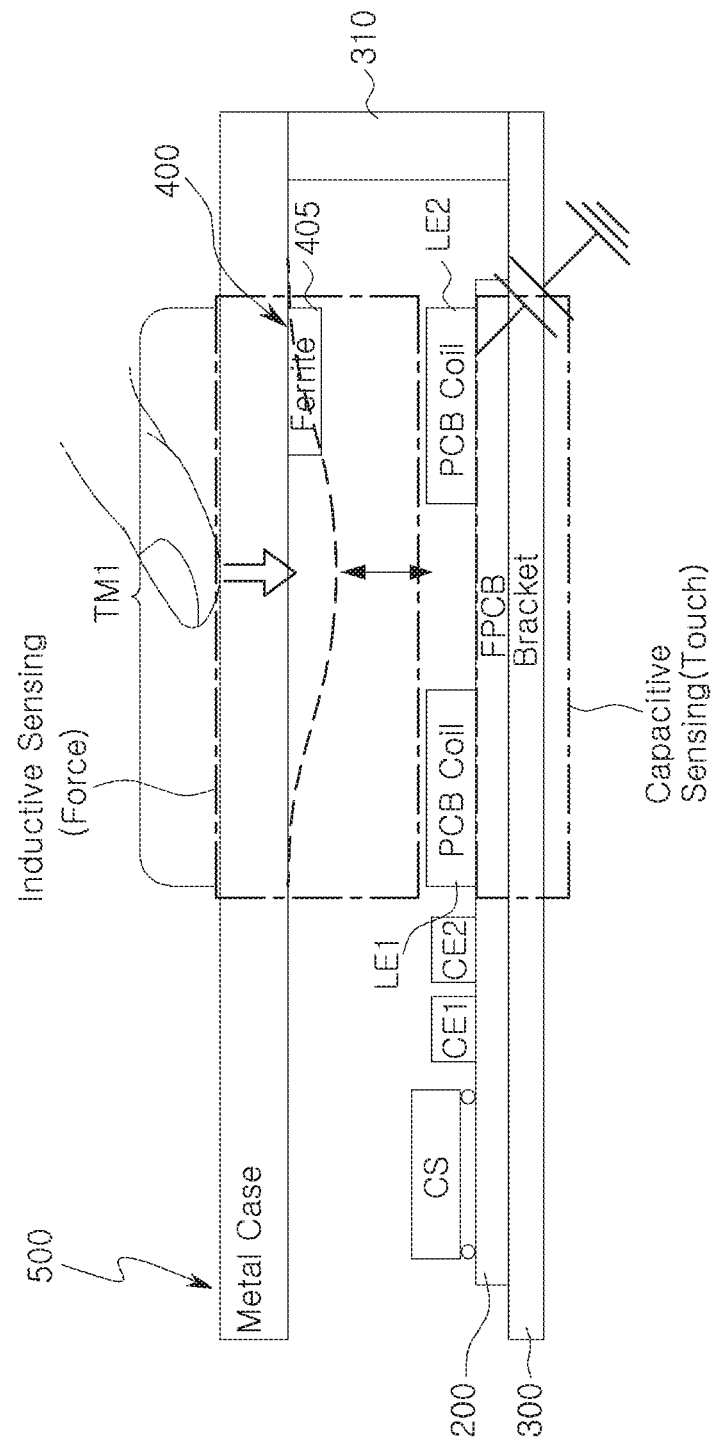
FIG. 7 illustrates an example of a sensing structure of a force operation sensing device, in accordance with one or more embodiments.

FIG. 7 illustrates an example of a sensing structure of a force operation sensing device, in accordance with one or more embodiments.

Referring to FIG. 7, the first inductor element LE1 may be mounted on a first surface of the substrate 200 to be spaced apart from an inner surface of the first operating member TM1. The second inductor element LE2 may be mounted on the first surface of the substrate 200, to be respectively spaced apart from an inner surface of the first operating member TM1 and the first inductor element LE1.

In a non-limiting example, the first inductor element LE1 and the second inductor element LE2 may be PCB coils or chip inductors, but the example is not limited thereto. As the first inductor element LE1 and the second inductor element LE2, any device or chip having inductance may be used.

To implement a differential sensing structure, a magnetic member 405 may be arranged in a spaced apart manner from the first inductor element LE1 and the second inductor element LE2, may face the second inductor element LE2, and may be attached to an inner surface of the first operating member TM1. However, the examples are not limited thereto.

Additionally, in FIG. 7, a circuit unit CS may include a portion (for example, an amplifier) of the oscillating circuit 600, and a force detection circuit 700, and for example, may be mounted on a first surface of the substrate 200. First and second capacitor elements CE1 and CE2 may be included in first and second oscillating circuits 610 and 620 of the oscillating circuit 600 to provide capacitance, and for example, may be mounted on a first surface of the substrate 200. The substrate 200 may be supported by a bracket 300.

The bracket 300 may support the substrate 200 and may be attached to or installed in an internal structure of an electronic device. Accordingly, the bracket 300 may be configured in such a manner that a distance between the first inductor element LE1 and the first operating member TM1, and a distance between the second inductor element LE2 and the magnetic member 401 may be constantly maintained, to perform an inductive sensing operation in which application of force may be detected by the sensing structure illustrated in FIG. 3.

Additionally, a connection member 310 may be further disposed between the first operating member TM1 and the bracket 300. The connection member 310 may be respectively connected to the first operating member TM1 and the bracket 300.

The sensing structure illustrated in FIG. 7 may include a first inductor element LE1 and a first operating member TM1 spaced apart from each other, and a second inductor element LE2 and a magnetic member 401 spaced apart from each other, thereby performing inductive sensing operation. Additionally, the sensing structure may be comprised of the first operating member TM1, the connection member 310, the bracket 300, the substrate 200, and the first and second inductor elements LE1 and LE2, thereby performing a capacitive sensing operation.

Figure 8:
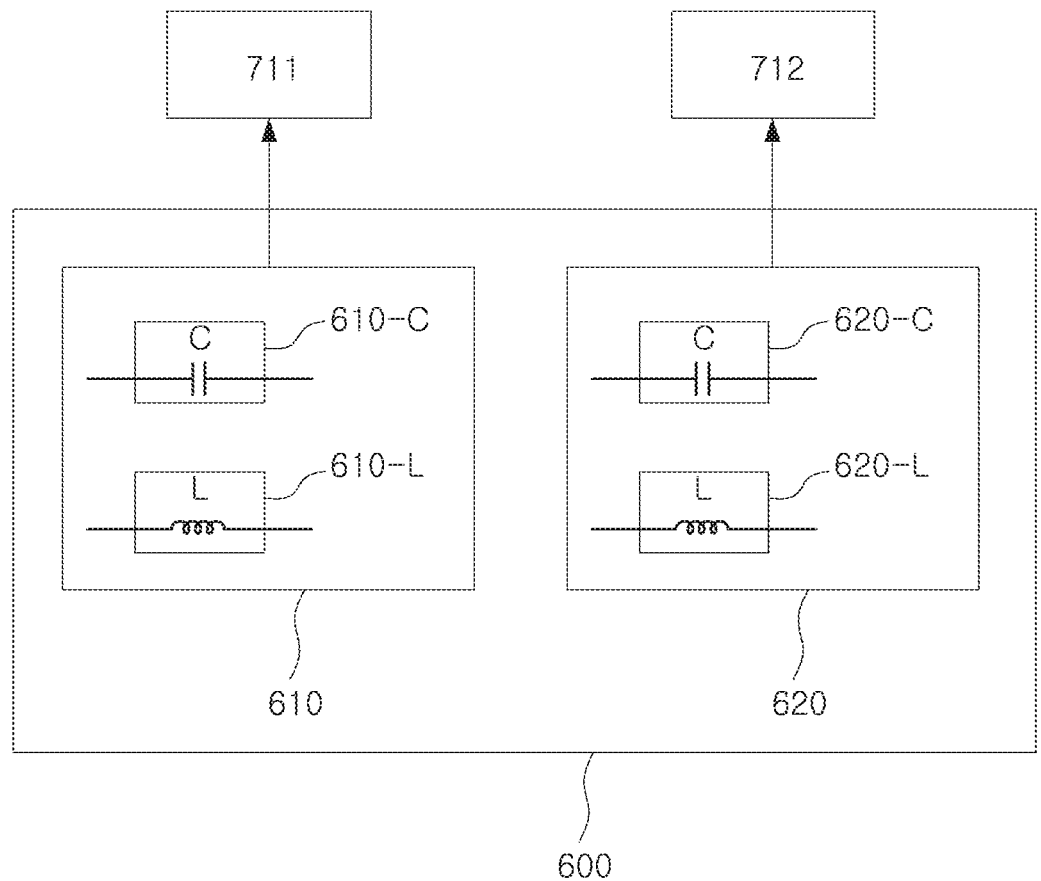
FIG. 8 illustrates an example of an oscillating circuit where no touch or force operation is applied, in accordance with one or more embodiments.

FIG. 8 illustrates an example of an oscillating circuit in an example where no touch or force operation is applied.

Referring to FIG. 8, the first oscillating circuit 610 may include a first capacitance circuit 610-C and a first inductance circuit 610-L.

The first capacitance circuit 610-C may include a capacitance of the first capacitor element CE1. The first inductance circuit 610-L may include an inductance of the first inductor element LE1.

The second oscillating circuit 620 may include a second capacitance circuit 620-C and a second inductance circuit 620-L.

The second capacitance circuit 620-C may include a capacitance of the second capacitor element CE2. The second inductance circuit 620-L may include an inductance of the second inductor element LE2.

In this example, the first capacitor element CE1 may be included in the first oscillating circuit 610, and may contribute to a first resonant frequency fres1 together with the first inductor element LE1. Additionally, the second capacitor element CE2 may be included in the second oscillating circuit 620, and may contribute to a second resonant frequency fres2 together with the second inductor element LE2.

Figure 9:
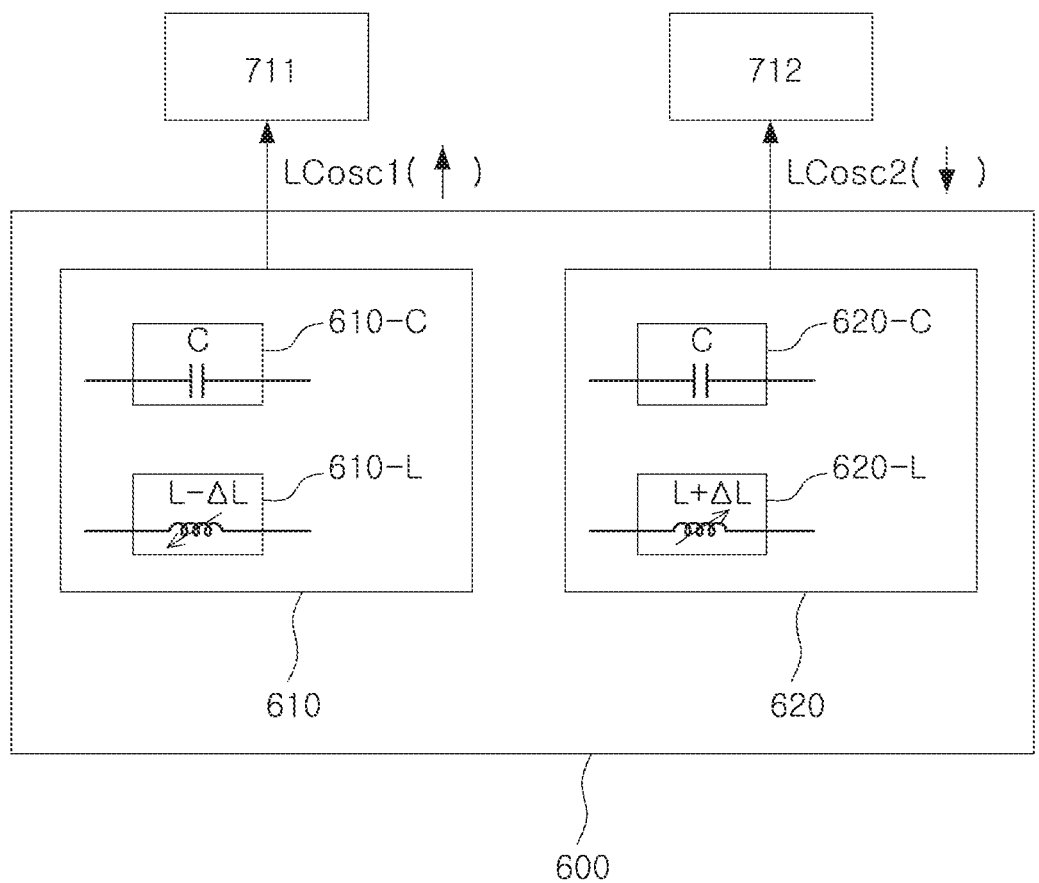
FIG. 9 illustrates an example of an oscillating circuit in an inductive sensing operation by application of an operation, in accordance with one or more embodiments.

FIG. 9 illustrates an example of an oscillating circuit in an inductive sensing operation when a touch or force operation is applied, in accordance with one or more embodiments.

Referring to FIG. 9, when the oscillating circuit 600 performs an inductive sensing operation based on the application of a touch or a force, for example, the inductance of the first inductance circuit 610-L may be reduced (L−ΔL), and inductance of the second inductance circuit 620-L may be increased (L+ΔL).

Figure 10:
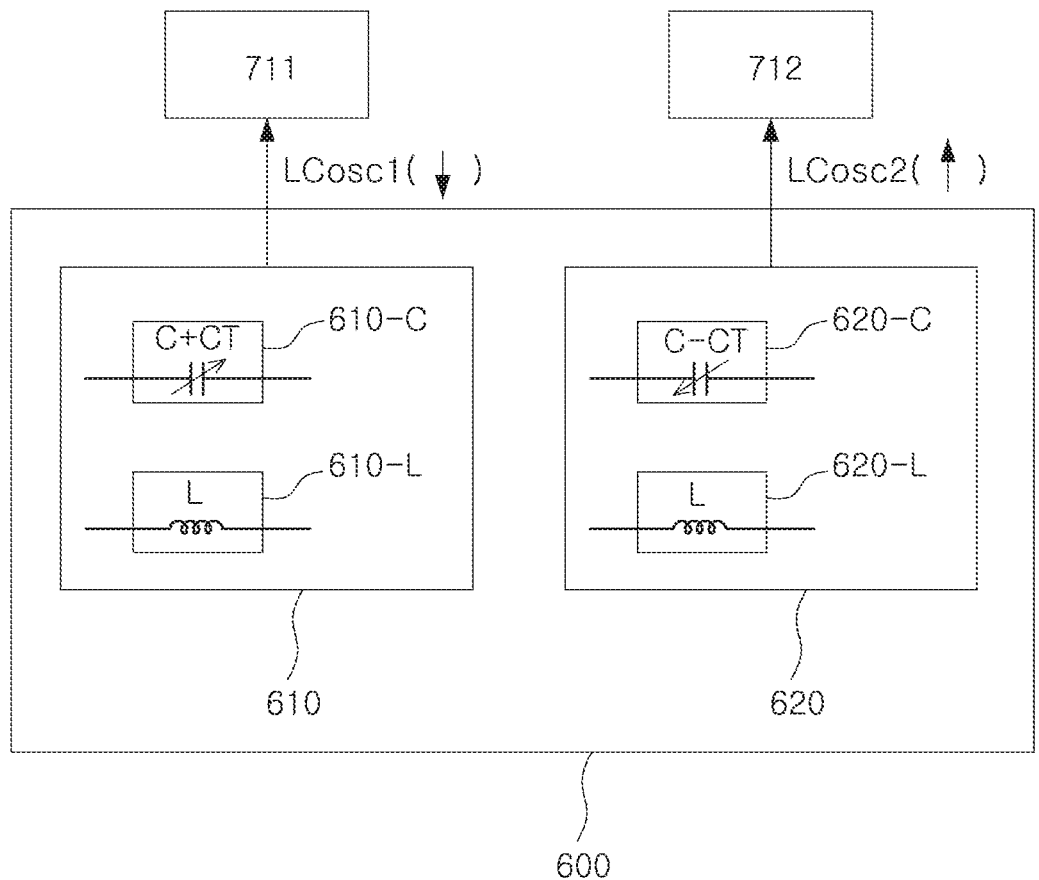
FIG. 10 illustrates an example of an oscillating circuit in a capacitive sensing operation by application of an operation, in accordance with one or more embodiments.

FIG. 10 illustrates an example of an oscillating circuit in a capacitive sensing operation when a touch or force operation is applied, in accordance with one or more embodiments.

Referring to FIG. 10, when the oscillating circuit 600 performs a capacitive sensing operation based on the application of a touch or force operation, for example, the capacitance of the first capacitance circuit 610-C may be increased (C+CT), and the capacitance of the second capacitance circuit 620-C may be reduced (C−CT).

Figure 11:
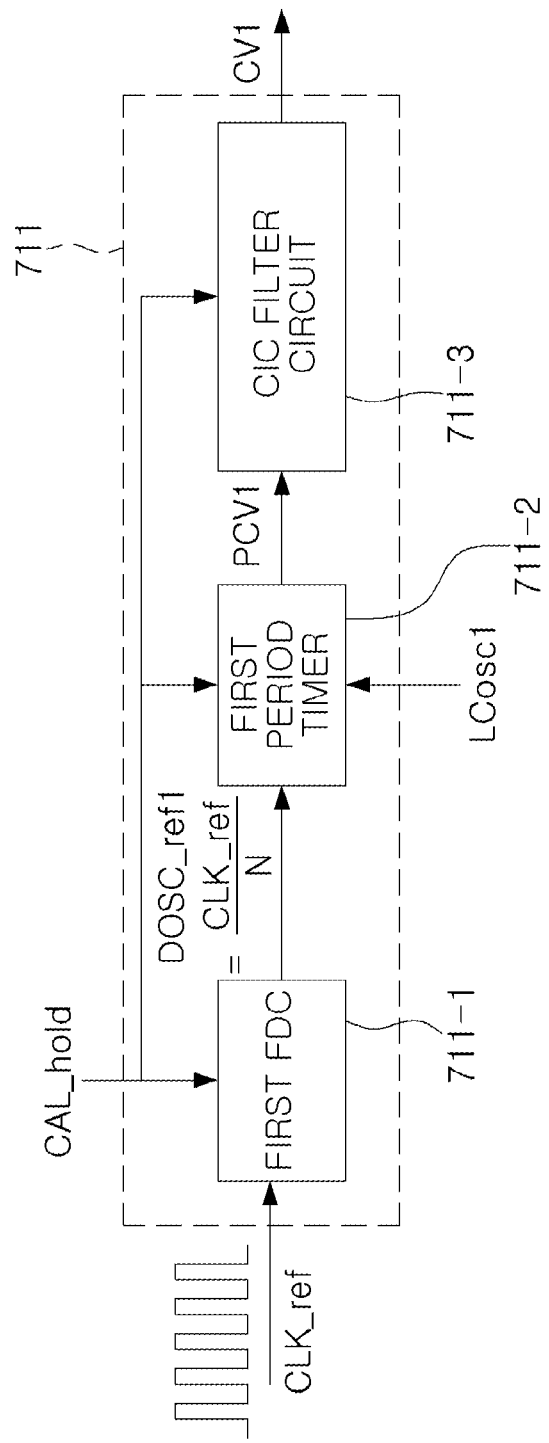
FIG. 11 illustrates an example of a digital frequency converter, in accordance with one or more embodiments.

FIG. 11 illustrates an example of a digital frequency converter, in accordance with one or more embodiments.

Referring to FIG. 11, the first digital frequency converter (FDC1) 711 may include a first frequency down converter 711-1, a first period timer 711-2, and a first cascaded integrator-comb (CIC) filter circuit 711-3.

The first frequency down converter 711-1 may divide the reference clock signal CLK_ref by using a reference division ratio N to generate a first divided reference clock signal DOSC_ref1.

The first period timer 711-2 may generate a first period count value PCV1 by counting one cycle of time of the first divided reference clock signal DOSC_ref1 by using the first oscillation signal.

The first CIC filter circuit 711-3 may generate a first count value CV1 by performing cumulative amplification on the first period count value PCV1. For example, when the first CIC filter circuit 711-3 is implemented as a decimator CIC filter, the decimator CIC filter may include an integrating circuit, a decimator, and a differential circuit. In this example, the cumulative gain may be obtained as [(R*M)^S], based on the stage order S of the integrating circuit, a decimator factor R and the delay order M of the differential circuit.

Figure 12:
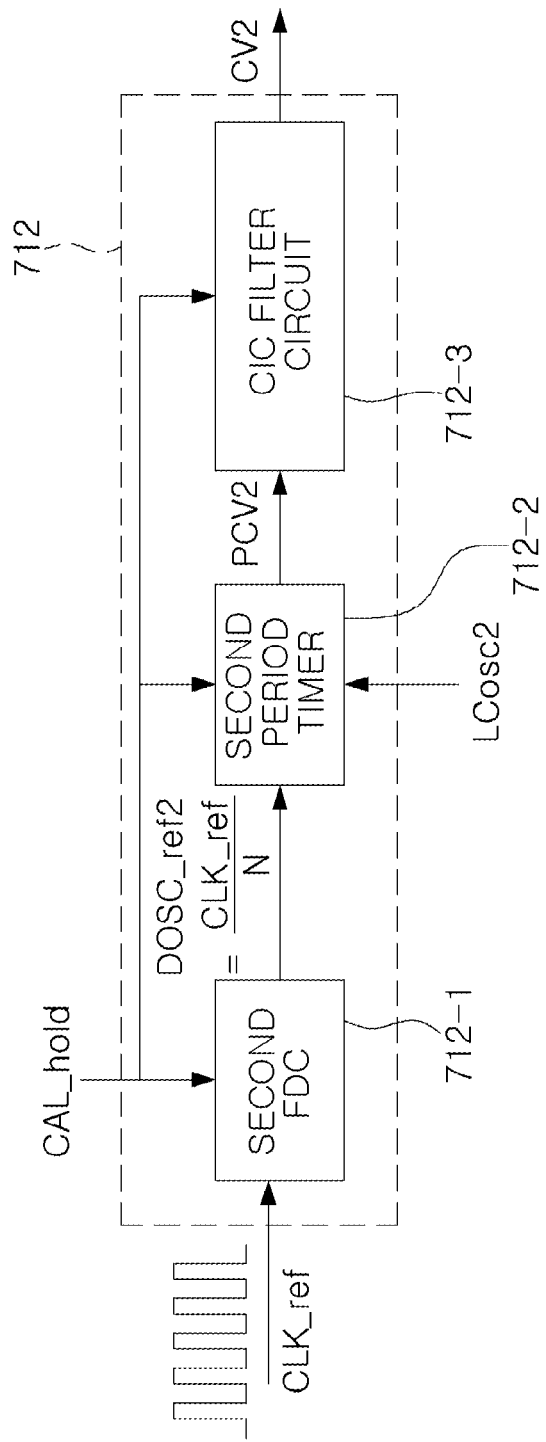
FIG. 12 illustrates an example of a digital frequency converter, in accordance with one or more embodiments.

FIG. 12 illustrates an example of a digital frequency converter, in accordance with one or more embodiments.

Referring to FIG. 12, the second digital frequency converter (FDC2) 712 may include a second frequency down converter 712-1, a second period timer 712-2, and a second CIC filter circuit 712-3.

The second frequency down converter 712-1 may divide the reference clock signal CLK_ref by using a reference division ratio N to generate a second divided reference clock signal DOSC_ref2.

The second period timer 712-2 may generate a second period count value PCV2 by counting one cycle of time of the second divided reference clock signal DOSC_ref using the second oscillation signal.

The second CIC filter circuit 712-3 may generate a second count value CV2 by performing cumulative amplification on the second period count value PCV2. For example, when the second CIC filter circuit 712-3 is implemented as a decimator CIC filter, the decimator CIC filter may include an integrating circuit, a decimator, and a differential circuit. In this example, the cumulative gain may be obtained as [(R*M)^S] based on the stage order S of the integrating circuit, a decimator factor R and the delay order M of the differential circuit.

In an example, in the first CIC filter circuit 711-3 and the second CIC filter circuit 712-3, when the stage order S of the integrating circuit is 4, the decimator factor R is 1, and the delay order M of the differential circuit Is 4, the cumulative gain may be 256[(1*4)^4].

Figure 13:
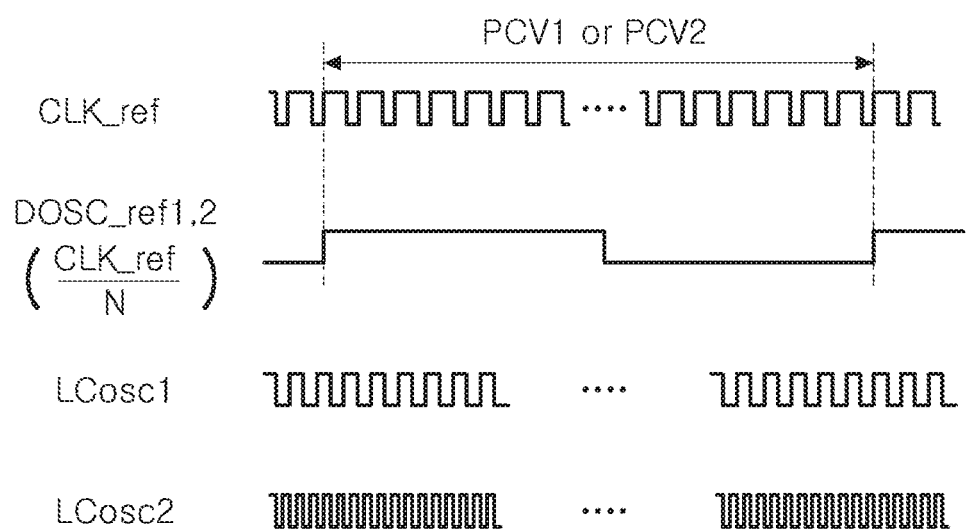
FIG. 13 illustrates examples of main signals, in accordance with one or more embodiments.

FIG. 13 illustrates examples of main signals of FIGS. 11 and 12.

Referring to FIG. 13, a reference clock signal CLK_ref is a signal prepared in advance for a count operation. The first and second divided reference clock signals DOSC_ref1 and DOSC_ref2 are signals obtained by dividing the reference clock signal CLK_ref by a division ratio N, and are signals that are respectively output by the first and second frequency down converters 711-1 and 712-1. The first oscillation signal LCosc1 is a signal output from the first oscillating circuit 610, and the second oscillation signal LCosc2 is a signal output from the second oscillating circuit 620.

In an example, the first oscillation signal LCosc1 may be two times or higher than the frequency of the reference clock signal CLK_ref. Additionally, the second oscillation signal LCosc2 may be two times or higher than the frequency of the reference clock signal CLK_ref. In a non-limiting example, the reference clock signal CLK_ref may be 10

KHz, and the first and second oscillation signals LCosc1 and LCosc2 may be 105 KHz and 95 KHz.

Figure 14:
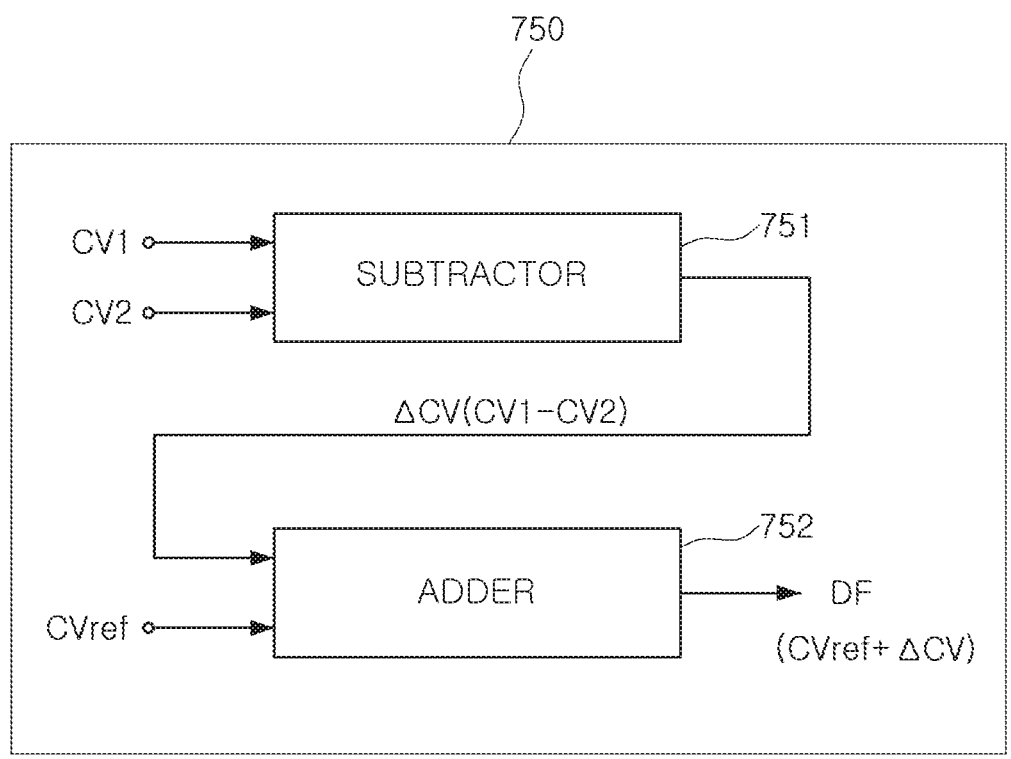
FIG. 14 illustrates an example of a force detection circuit, in accordance with one or more embodiments.
Figure 15:
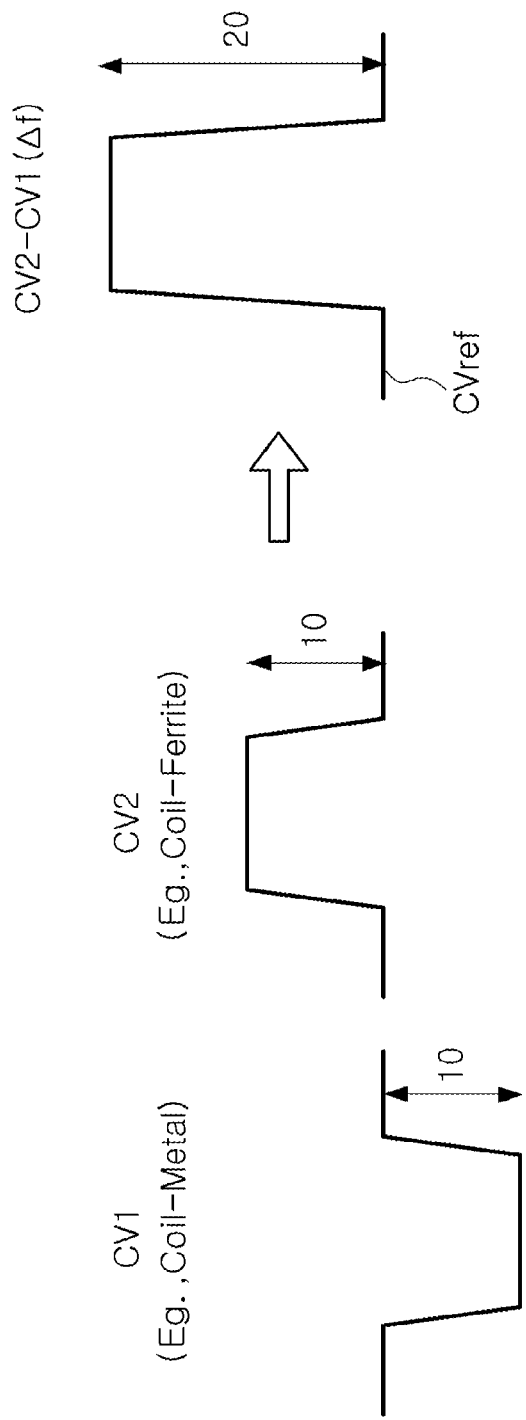
FIG. 15 illustrates an example of a sensing principle that improves sensitivity, in accordance with one or more embodiments.

FIG. 14 illustrates an example of a force detection circuit, and FIG. 15 illustrates an example of a sensing principle capable of improving sensitivity, in accordance with one or more embodiments.

Referring to FIGS. 14 and 15, the force detector 750 may include a subtractor 751 and an adder 752.

The subtractor 751 may obtain the frequency difference Δf by subtracting the first and second count values CV1 and CV2.

The adder 752 may add the frequency difference Δf and the reference value CVref to detect whether the operation is performed based on the added value, and may detect a detection signal DF having a level corresponding to the operation. For example, the detection signal DF may have a high level when a force operation is applied, or may have a low level when the force operation is not applied.

As such, when detecting whether the touch or force operation is performed based on the added value obtained by adding the frequency difference Δf and the reference value CVref, precision or sensitivity with respect to whether the operation is detected may be improved, compared with an example in which the frequency difference Δf is not reflected.

Figure 16:
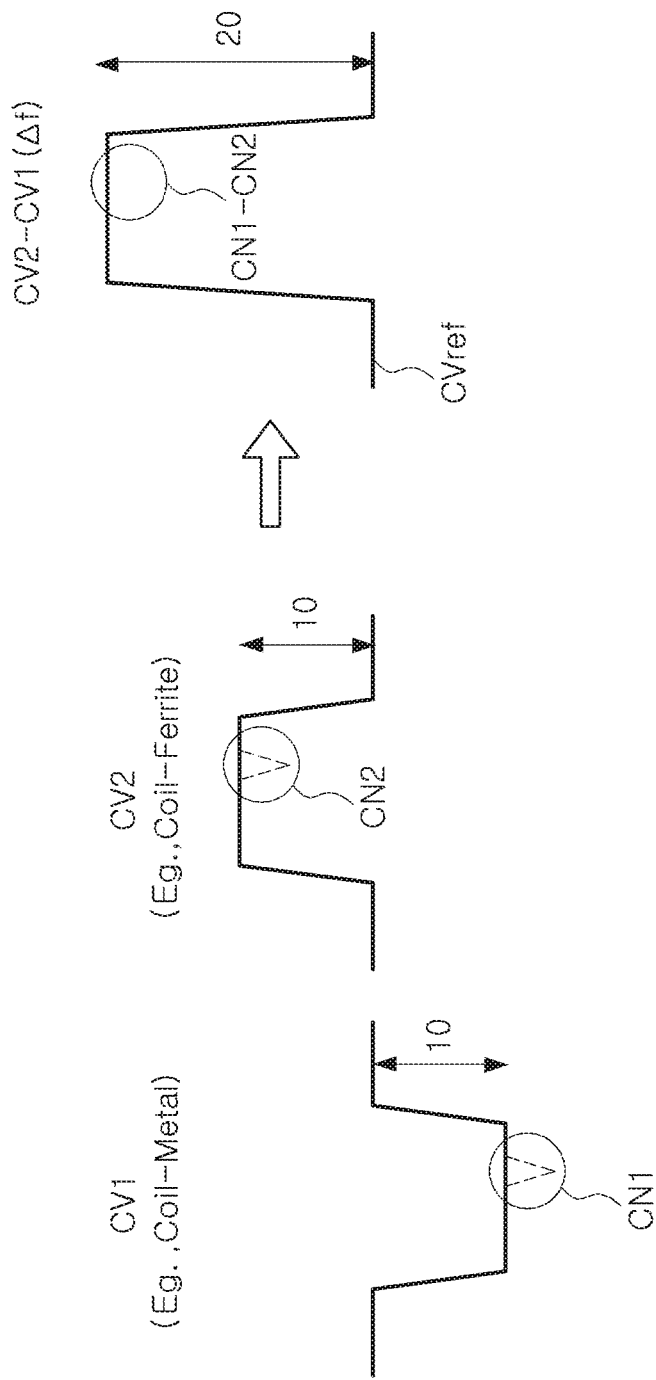
FIG. 16 illustrates an example of a sensing principle in which common noise may be reduced, in accordance with one or more embodiments.

FIG. 16 illustrates an example of a sensing principle in which common noise may be reduced, in accordance with one or more embodiments.

Referring to FIGS. 14 and 16, in the process of subtracting the first and second count values CV1 and CV2, the subtractor 751 may eliminate common noise components CN1 and CN2 of the same phase included in the first and second count values CV1 and CV2, respectively. As described above, the common noise component may be removed, and the signal gain may be increased depending on the added value obtained by adding the frequency difference Δf and the reference value CVref, thereby improving sensitivity.

As set forth above, according to examples, by implementing the sensing for operation occurrence to be performed by a differential operation, common noise may be efficiently removed, gain may be increased, and thus, sensing sensitivity may be improved.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A force operation sensing device to be added to an electronic device, the electronic device comprising an input operation unit comprising a first operating member disposed in a housing, the force operation sensing device comprising:
    a magnetic member, disposed inside the input operation unit; and
    an oscillating circuit comprising a first inductor element and a second inductor element,
    wherein when a force operation is applied to the first operating member, the oscillating circuit is configured to generate a first variable resonant frequency based on an interaction between the first operating member and the first inductor element, and generate a second variable resonant frequency, which is inversely varied with the variation of the first variable resonant frequency, based on an interaction between the magnetic member and the second inductor element.

2. The force operation sensing device of claim 1, wherein the first inductor element is disposed adjacent to the first operating member, and the second inductor element is disposed to face the magnetic member.

3. The force operation sensing device of claim 1, further comprising a force detection circuit configured to determine a frequency difference between the first variable resonant frequency and the second variable resonant frequency, and detect the force operation based on the determined frequency difference.

4. The force operation sensing device of claim 3, wherein the oscillating circuit further comprises:
    a first oscillating circuit configured to generate a first oscillation signal comprising the first variable resonant frequency; and
    a second oscillating circuit configured to generate a second oscillation signal comprising the second variable resonant frequency which is inversely varied with the variation of the first variable resonant frequency.

5. The force operation sensing device of claim 4, wherein the first inductor element is spaced apart from an inner surface of the first operating member, and is mounted on a first surface of a substrate,
    the second inductor element is respectively spaced apart from the inner surface of the first operating member and the first inductor element, and is mounted on the first surface of the substrate, and
    the magnetic member is spaced apart from the first inductor element and the second inductor element, faces the second inductor element, and is attached to the inner surface of the first operating member.

6. The force operation sensing device of claim 4, wherein the force detection circuit comprises:
    a digital frequency converter configured to convert the first oscillation signal into a first count value, and convert the second oscillation signal into a second count values; and
    a force detector configured to determine the frequency difference based on the first count value and the second count value, and detect the force operation based on the determined frequency difference.

7. The force operation sensing device of claim 6, wherein the digital frequency converter comprises:
    a first digital frequency converter configured to generate the first count value by counting a reference clock signal based on the first oscillation signal; and
    a second digital frequency converter configured to generate the second count value by counting the reference clock signal based on the second oscillation signal.

8. The force operation sensing device of claim 7, wherein the first digital frequency converter comprises:
    a first frequency down converter configured to divide the reference clock signal by using a reference division ratio to generate a first divided reference clock signal;

a first period timer configured to generate a first period count value by counting one period of time of the first divided reference clock signal based on the first oscillation signal; and a first cascaded integrator-comb (CIC) filter circuit configured to generate the first count value by performing cumulative amplification on the first period count value.

9. The force operation sensing device of claim 8, wherein the second digital frequency converter comprises:

a second frequency down converter configured to divide the reference clock signal by using a reference division ratio to generate a second divided reference clock signal;

a second period timer configured to generate a second period count value by counting one cycle of time of the second divided reference clock signal based on the second oscillation signal; and a second CIC filter circuit configured to generate the second count value by performing cumulative amplification on the second period count value.

10. The force operation sensing device of claim 8, wherein the first oscillation signal is two or more times higher than a frequency of the reference clock signal, and the second oscillation signal is two or more times higher than the frequency of the reference clock signal.

11. The force operation sensing device of claim 6, wherein the force detector comprises:

a subtractor configured to subtract the first second count value from the first count value to obtain the determined frequency difference; and an adder configured to add the determined frequency difference and a reference value to generate a detection signal.

12. The force operation sensing device of claim 4, wherein the first inductor element is attached to an inner surface of the first operating member, the second inductor element faces the magnetic member, is mounted on a first surface of a substrate, and is spaced apart from the magnetic member, and the magnetic member is respectively spaced apart from the first inductor element and the second inductor element, faces the second inductor element, and is disposed on the inner surface of the first operating member, wherein the force operation sensing device further comprises a first conductive member respectively spaced apart from the first inductor element and the second inductor element, faces the first inductor element, and is mounted on the first surface of the substrate.

13. The force operation sensing device of claim 4, wherein the first inductor element is mounted on a first surface of a substrate, and a second surface of the substrate is attached to an inner surface of the first operating member, the second inductor element is spaced apart from the first inductor element, and is mounted on the first surface of the substrate, and the magnetic member is respectively spaced apart from the first inductor element and the second inductor element, is disposed on a bracket, and faces the second inductor element, wherein the force operation sensing device further comprises:

a second conductive member spaced apart from the magnetic member, is disposed on the bracket, and faces the first inductor element.

14. The force operation sensing device of claim 4, wherein the first inductor element is mounted on a first surface of a substrate, and is spaced apart from an inner surface of the first operating member, the second inductor element is attached to the inner surface of the first operating member, and the magnetic member is respectively spaced apart from the first inductor element and the second inductor element, is mounted on the first surface of the substrate, and faces the second inductor element.

15. The force operation sensing device of claim 4, wherein the first inductor element is spaced apart from an inner surface of the first operating member, and is mounted on a first surface of a substrate, the second inductor element is mounted on the first surface of the substrate, and is respectively spaced apart from an inner surface of the first operating member and the first inductor element, and the magnetic member is spaced apart from the first inductor element and the second inductor element, is attached to the inner surface of the first operating member, and faces the second inductor element, wherein the force operation sensing device further comprises a connection member disposed between the first operating member and a bracket, and is configured to connect the first operating member and the bracket.

16. The force operation sensing device of claim 4, wherein the first oscillating circuit comprises:

a capacitance circuit including a capacitance of a capacitor element; and an inductance circuit including an inductance of the first inductor element.

17. The force operation sensing device of claim 4, wherein the second oscillating circuit comprises:

a capacitance circuit including a capacitance of a capacitor element; and an inductance circuit including an inductance of the second inductor element.

18. The force operation sensing device of claim 1, wherein the first operating member has conductive properties.

19. An apparatus comprising:

an input operation unit;

an oscillating circuit configured to generate at least a first oscillating signal comprising a first resonant frequency, and generate a second oscillating signal comprising a second resonant frequency based on an application of a force to an operating member, wherein the second resonant frequency is inversely varied with the variation of the first resonant frequency; and a force detection circuit configured to:
 convert the first oscillating signal into a first count value, and convert the second oscillating signal into a second count value;
 determine a frequency difference of the first oscillating signal and the second oscillating signal based on the first count value and the second count value; and
 detect the application of the force based on the determined frequency difference.

20. The force operation sensing device of claim 19, wherein the first oscillating signal is generated based on an interaction between the operating member and a first inductor element of the oscillating circuit, and the second oscillating signal is generated based on an interaction between a magnetic member and a second inductor element of the oscillating circuit.

* * * * *